(12) United States Patent
Chen et al.

(10) Patent No.: US 9,082,764 B2
(45) Date of Patent: Jul. 14, 2015

(54) THREE-DIMENSIONAL INTEGRATED CIRCUIT WHICH INCORPORATES A GLASS INTERPOSER AND METHOD FOR FABRICATING THE SAME

(71) Applicant: Corning Incorporated, Corning, NY (US)

(72) Inventors: Yi-An Chen, New Taipei (TW); Yung-Jean Lu, Taipei (TW); Windsor Pipes Thomas, III, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 145 days.

(21) Appl. No.: 13/780,490

(22) Filed: Feb. 28, 2013

(65) Prior Publication Data

US 2013/0228918 A1    Sep. 5, 2013

Related U.S. Application Data

(60) Provisional application No. 61/606,683, filed on Mar. 5, 2012.

(51) Int. Cl.
*H01L 21/00* (2006.01)
*H01L 23/498* (2006.01)
(Continued)

(52) U.S. Cl.
CPC ...... *H01L 23/49811* (2013.01); *H01L 21/4846* (2013.01); *H01L 23/5384* (2013.01);
(Continued)

(58) Field of Classification Search
CPC .............. H01L 23/49811; H01L 25/50; H01L 25/0657; H01L 21/4846; H01L 23/5384; H01L 2224/73253; H01L 2224/7365; H01L 2924/15311; H01L 2224/48091; H01L 2224/16; H01L 2224/48227; H01L 23/15; H01L 2225/06572; H01L 23/49827
USPC .................................................. 257/737, 774
See application file for complete search history.

(56) References Cited

U.S. PATENT DOCUMENTS

| 7,951,647 | B2 | 5/2011 | Yang et al. ..................... 438/109 |
| 7,998,862 | B2 | 8/2011 | Park et al. ..................... 438/667 |

(Continued)

FOREIGN PATENT DOCUMENTS

| KR | 2008094147 A | 10/2008 |
| KR | 919080 B1 | 9/2009 |

(Continued)

OTHER PUBLICATIONS

Gokul Kumar et al: "Ultra-high I/O density glass/silicon interposers for high bandwidth smart mobile applications" Electronic Components and Technology Conference (ECTC), 2011 IEEE 61$^{st}$, IEEE, May 31, 2011, pp. 217-223, XP031996541.

(Continued)

*Primary Examiner* — Laura Menz
(74) *Attorney, Agent, or Firm* — John T. Haran

(57) ABSTRACT

A three-dimensional integrated circuit (3D-IC) which incorporates a glass interposer and a method for fabricating the three-dimensional integrated circuit (3D-IC) with the glass interposer are described herein. In one embodiment, the 3D-IC incorporates a glass interposer which has vias formed therein which are not filled with a conductor that allow for precision metal-to-metal interconnects (for example) between redistribution layers. In another embodiment, the 3D-IC incorporates a glass interposer which has vias and has a coefficient of thermal expansion (CTE) that is different than the CTE of silicon which is 3.2 ppm/° C.

21 Claims, 10 Drawing Sheets

(51) Int. Cl.
*H01L 21/48* (2006.01)
*H01L 23/538* (2006.01)
*H01L 25/065* (2006.01)
*H01L 25/00* (2006.01)
*H01L 23/15* (2006.01)

(52) U.S. Cl.
CPC ............ *H01L25/0657* (2013.01); *H01L 25/50* (2013.01); *H01L 23/15* (2013.01); *H01L 23/49827* (2013.01); *H01L 2224/16* (2013.01); *H01L 2224/48091* (2013.01); *H01L 2224/48227* (2013.01); *H01L 2224/73253* (2013.01); *H01L 2224/73265* (2013.01); *H01L 2225/06513* (2013.01); *H01L 2225/06572* (2013.01); *H01L 2924/15311* (2013.01)

(56) References Cited

U.S. PATENT DOCUMENTS

| | | | |
|---|---|---|---|
| 8,053,902 B2 | 11/2011 | Chen et al. | 257/776 |
| 8,222,139 B2 | 7/2012 | Chen et al. | 438/667 |
| 8,253,227 B2 | 8/2012 | Osada et al. | 257/685 |
| 8,264,066 B2 | 9/2012 | Lo et al. | 257/621 |
| 8,269,337 B2 | 9/2012 | Hu et al. | 257/700 |
| 8,766,460 B2 * | 7/2014 | Wu | 257/778 |
| 2008/0248250 A1 | 10/2008 | Flemming et al. | 428/156 |
| 2009/0302485 A1 | 12/2009 | Fan | 257/780 |
| 2011/0109338 A1 | 5/2011 | Yakabe et al. | 324/756.03 |
| 2011/0180913 A1 | 7/2011 | Liou et al. | 257/666 |
| 2011/0217657 A1 | 9/2011 | Flemming et al. | 430/270.1 |
| 2011/0227226 A1 | 9/2011 | Chiang et al. | 257/751 |
| 2011/0241040 A1 | 10/2011 | Yu et al. | 257/91 |
| 2012/0048604 A1 | 3/2012 | Cornejo et al. | 174/258 |
| 2012/0106117 A1 | 5/2012 | Sundaram et al. | 361/808 |
| 2012/0212917 A1 | 8/2012 | Shin et al. | 361/767 |
| 2012/0326334 A1 | 12/2012 | Sakaguchi | 257/778 |

FOREIGN PATENT DOCUMENTS

| | | |
|---|---|---|
| KR | 201106525 A | 1/2011 |
| KR | 1054565 B1 | 8/2011 |
| TW | 200921815 A | 5/2009 |
| TW | 201015687 A | 4/2010 |
| WO | 2007037106 A1 | 4/2007 |
| WO | 2011109648 A1 | 9/2011 |

OTHER PUBLICATIONS

EPO International Search Report dated Jul. 18, 2013.

* cited by examiner

THREE-DIMENSIONAL INTEGRATED CIRCUIT WHICH INCORPORATES A GLASS INTERPOSER AND METHOD FOR FABRICATING THE SAME

CROSS-REFERENCE TO RELATED APPLICATIONS

This application claims the benefit of priority under 35 U.S.C. §119 of U.S. Provisional Application Ser. No. 61/606,683 filed on 5 Mar. 2012 the content of which is relied upon and incorporated herein by reference in its entirety.

TECHNICAL FIELD

The present invention relates to a three-dimensional integrated circuit which incorporates a glass interposer and a method for fabricating the three-dimensional integrated circuit with the glass interposer.

BACKGROUND

Moore's law is perhaps one of the best known trends among a wide range of technologies relating to semiconductor integrated circuits. Moore's law describes a trend in computing hardware where the number of transistors that can be placed inexpensively on an integrated circuit doubles approximately every two years. This trend has continued for more than half a century and is expected to continue for at least the next few years. Moore's law has served the industry well and has even been incorporated for decades into the International Technology Roadmap for Semiconductors, known throughout the world as ITRS, for guiding long-term planning and setting targets for research and development.

The cost of making smaller and smaller critical dimensions (nodes) on semiconductor integrated circuits has been increasing dramatically the past few years during the transition from i-Line to KrF to ArF and now to the newly emerging extreme ultraviolet (EUV) photolithography technologies. In view of this, a few industry experts have contended that there is not much farther the semiconductor industry can cost effectively reduce the size of critical dimensions on semiconductor integrated circuits in the same time frame as stated by Moore's Law.

However, there is another mechanism that can be used to improve performance which relates to the packaging of the integrated circuits. Once a wafer of integrated circuits is completed and diced, the integrated circuit needs to be packaged to be of use. FIG. 1 (PRIOR ART) is a diagram illustrating how the packaging of integrated circuits has evolved over the years from wire bound 102, flip chip 104, stacked die 106, package-on-package 108 to the emerging three-dimensional integrated circuit 110 (3D IC 110). The semiconductor industry has undertaken an increasingly aggressive approach to develop, adapt, and implement the emerging 3D IC packaging technology.

The three-dimensional integrated circuit 110 (3D IC 110) is a semiconductor circuit in which two or more layers of active electronic components are integrated both vertically and horizontally into a single circuit. 3D IC packaging should not be confused with 3D packaging which has been in use for years and saves space by stacking separate chips in a single package. The 3D packaging also known as System in Package (SiP) does not integrate the chips into a single circuit. In particular, the chips in the SiP communicate with off-chip controls much as if they were mounted in separate packages on a normal circuit board.

In contrast, the 3D IC 110 acts as a single chip where all the components on the different layers communicate with on-chip controls either vertically or horizontally. Basically, the new 3D IC packaging technology by stacking integrated circuits, or die, on top of each other results in a 3D IC 110 which has improved speed, reduced power, and reduced cost when compared to the ICs manufactured by the other packaging technologies. In fact, the advantages associated with 3D IC packaging could help extend the performance of Moore's law and possibly extend the performance even more than predicted by Moore's law.

The 3D IC packaging technology can be used to fabricate many different types of three-dimensional integrated circuits from, for example, memory stacks to Field Programmable Gate Arrays (FPGAs). Referring to FIG. 2 (PRIOR ART), there is a photo of a Xilinx 3D IC FPGA 200 incorporating a silicon interposer 202 that is manufactured by Taiwan Semiconductor Manufacturing Company. The Xilinx 3D IC FPGA 200 comprises a FPGA slice 204 which includes redistribution layers 205 with micro bumps 206 formed thereon where the FPGA slice 204 is positioned next to one side of the silicon interposer 202. The other side of the silicon interposer 202 is positioned next to a wiring board 208208 which has redistribution layers 207 with C4 bumps 210 located thereon. The silicon interposer 202 has vias 212 (known as through silicon vias (TSVs) 212) which are filled with copper 214 to provide precision interconnects between the micro bumps 206 and the C4 bumps 210. The wiring board 208 has redistribution layers 209 on another side thereof which are used to connect the C4 bumps 210 to ball grid arrays 211 (BGAs 211) which are attached to a motherboard 215. The architecture of the Xilinx 3D IC FPGA 200 is commonly referred to as a "2.5D IC" because there are multiple ICs on the interposer as opposed to a vertical stack of multiple ICs.

In this particular example, the silicon interposer 202 provides the precision interconnects (vias 212 filled with copper 214) for the FPGA slice 204 and the wiring board 208 while also functioning to provide electrical separation (electrical isolation) between the FPGA slice 204 and the BGA 208. Typically, the silicon interposer 202 has vias 212 (TSVs 212) that are formed with relatively good quality using the Dry Reactive Ion Etch process (DRIE) which is also known in the industry as the "Bosch process". However, the DRIE process is not perfect. For example, the DRIE process cost significantly more when compared to the more conventional wire bond process, where the die connections are made along the periphery of the die directly to the packaging substrate. The wire bond process is not used to make a 3D IC 110 but nevertheless helps to illustrate the significant costs associated with the DRIE process.

Referring to FIG. 3 (PRIOR ART) there is a graph which illustrates the different steps and associated relative costs for performing the wire bond process 300 and the DRIE process 302 utilizing a 300 mm outer diameter silicon wafer. The DRIE process 302 in this example shows the steps and associated costs of forming vias 212 (TSVs 212) in the 300 mm outer diameter silicon wafer at 10 μm/min 302a, 20 μm/min 302b, 30 μm/min 302c, 40 μm/min 302d, and 50 μm/min 302e. The different steps in the wire bond process 300 and the DRIE process 302 are represented according to the following legend:
 lithography step 304
 etching step 306
 strip/clean step 308
 dielectric liner step 310
 barrier and seed steps 312
 lithography step 314

Cu electroplating and solder steps 316
strip step 318
wet etch barrier and seed steps 320
back grind and polish steps 322
die attach film step 324
via exposure step and via dielectric opening step 326
dicing (saw) step 328
pick & place and die attach steps 330
wire bond step 332

As the graph in FIG. 3 illustrates, the silicon interposers 202 with copper-filled vias 212 and 214 made by the DRIE process have a relatively high manufacturing cost. Accordingly, there is a need to address this shortcoming and other shortcomings associated with the traditional silicon interposer. This need and other needs are satisfied by the present invention.

SUMMARY

A three-dimensional integrated circuit, and a method for fabricating the three-dimensional integrated circuit are described in the independent claims of the present application. Advantageous embodiments of the three-dimensional integrated circuit, and the method for fabricating the three-dimensional integrated circuit are described in the dependent claims.

In one aspect, the present invention provides a three-dimensional integrated circuit comprising: (a) a first circuit component; (b) one or more first redistribution layers, where one of the first redistribution layers has a plurality of first conductive pillars extending therefrom; (c) a glass interposer having a body including a first surface and a second surface which are substantially parallel to each other, and where the body has a plurality of vias extending there through from the first surface to the second surface; (d) one or more second redistribution layers, where one of the second redistribution layers has a plurality of second conductive pillars extending therefrom; (e) a second circuit component; (f) the one or more first redistribution layers are positioned between the first circuit component and the first surface of the glass interposer; (g) the one or more second redistribution layers are positioned between the second circuit component and the second surface of the glass interposer; and (h) the glass interposer is positioned between the one first distribution layer and the one second distribution layer such that each one of the first conductive pillars contacts a corresponding one of the second conductive pillars, and where each pair of the first and second conductive pillars contact one another within one of the vias located in the glass interposer.

In another aspect, the present invention provides a method of fabricating a three-dimensional integrated circuit. The method comprising the steps of: (a) providing a first circuit component; (b) providing one or more first redistribution layers, where one of the first redistribution layers has a plurality of first conductive pillars extending therefrom; (c) providing a glass interposer having a body including a first surface and a second surface which are substantially parallel to each other, and where the body has a plurality of vias extending there through from the first surface to the second surface; (d) providing one or more second redistribution layers, where one of the second redistribution layers has a plurality of second conductive pillars extending therefrom; (e) providing a second circuit component; (f) positioning the one or more first redistribution layers between the first circuit component and the first surface of the glass interposer; (g) positioning the one or more second redistribution layers between the second circuit component and the second surface of the glass interposer; and (h) positioning the glass interposer between the one first distribution layer and the one second distribution layer such that each one of the first conductive pillars contacts a corresponding one of the second conductive pillars, and where each pair of the first and second conductive pillars contact one another within one of the vias located in the glass interposer.

In yet another aspect, the present invention provides a three-dimensional integrated circuit comprising: (a) a first circuit component; (b) one or more first redistribution layers; (c) a glass interposer having a body including a first surface and a second surface which are substantially parallel to each other, where the body has a plurality of vias extending there through from the first surface to the second surface, and where the body has a coefficient of thermal expansion (CTE) that is different than the CTE of silicon which is about 3.2 ppm/° C.; (d) one or more second redistribution layers; (e) a second circuit component; (f) the one or more first redistribution layers are positioned between the glass interposer and the first circuit component; (g) the one or more second redistribution layers are positioned between the glass interposer and the second circuit component; and (h) the glass interposer is positioned between one of the first distribution layers and one of the second distribution layers.

Additional aspects of the invention will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF THE DRAWINGS

A more complete understanding of the present invention may be had by reference to the following detailed description when taken in conjunction with the accompanying drawings wherein.

DETAILED DESCRIPTION

Figure 4A:
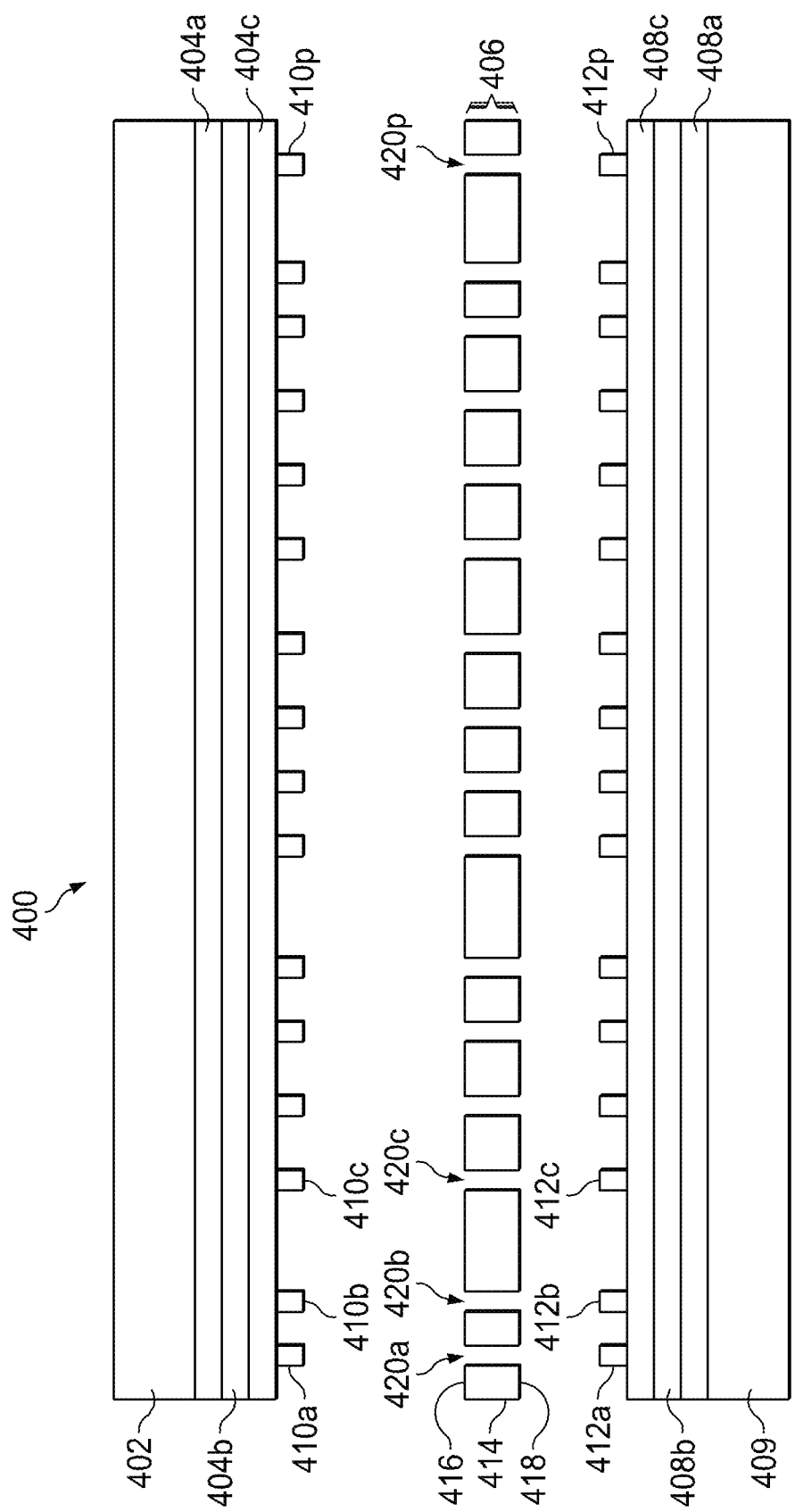
FIGS. 4A-4B respectively show a partially exploded side view and an assembled side view of a three-dimensional integrated circuit configured in accordance with an embodiment of the present invention.
Figure 4B:
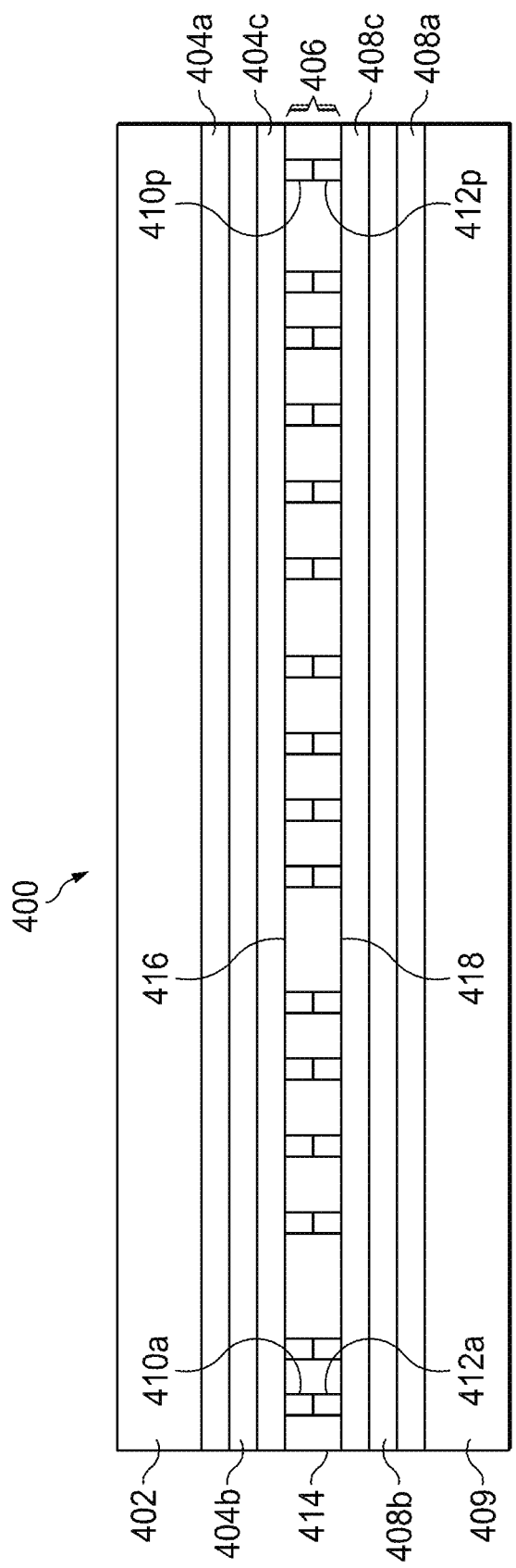

Referring to FIGS. 4A-4B, there are respectively shown a partially exploded side view and an assembled side view of a three-dimensional integrated circuit 400 configured in accordance with an embodiment of the present invention. The three-dimensional integrated circuit 400 includes a first circuit component 402 (e.g., die 402, motherboard 402), one or more first redistribution layers 404a, 404b and 404c (three shown), a glass interposer 406, one or more second redistribution layers 408a, 408b and 408c (three shown), and a second circuit component 409 (e.g., die 409, motherboard 409). The first redistribution layer 404c has a plurality of first conductive pillars 410a, 410b ... 410p (for example) extending therefrom. Likewise, the second redistribution layer 408c has a plurality of second conductive pillars 412a, 412b ... 412p (for example) extending therefrom. The glass interposer 406 has a body 414 including a first surface 416 and a second surface 418 which are substantially parallel to each other. The body 414 has a plurality of vias 420a, 420b ... 420p (for example) formed therein which extend there through from the first surface 416 to the second surface 418. The vias 420a, 420b ... 420p (through glass vias (TGVs) 420a, 420b ... 420p) do not have metal electroplating and are not filled with a conductive material such as copper, tin, nickel, gold or silver. The three-dimensional integrated circuit 400 may include additional components which are known in the field but for clarity only those components which are needed to explain and enable the present invention are described herein.

The three-dimensional integrated circuit 400 is fabricated such that the one or more first redistribution layers 404a, 404b and 404c are positioned between the first circuit component 402 and the first surface 416 of the glass interposer 406. Likewise, the one or more second redistribution layers 408a, 408b and 408c are positioned between the second circuit component 409 and the second surface 418 of the glass interposer 406. The glass interposer 406 is positioned between the first redistribution layer 404c and the second redistribution layer 408c such that each one of the first conductive pillars 410a, 410b ... 410p contacts a corresponding one of the second conductive pillars 412a, 412b ... 412p. The first conductive pillars 410a, 410b ... 410p and the corresponding second conductive pillars 412a, 412b ... 412p contact one another within one of the vias 420a, 420b ... 420p located in the glass interposer 406 (see FIG. 4B). Thus, the glass interposer 406 has vias 420a, 420b ... 420p formed therein which are not metalized that allow for precision metal-to-metal interconnects in the form of the first conductive pillars 410a, 410b ... 410p and the second conductive pillars 412a, 412b and 412c located on each side of the glass interposer 406 which meet in the middle of the precision vias 420a, 420b ... 420p to establish electrical connectivity while preserving perfect insulation (or substantially perfect insulation) elsewhere between the first and second circuit components 402 and 409 as well as any other adjacent electrical connections through the glass interposer 406. A detailed discussion is provided next about how the glass interposer 406 can be fabricated along with a discussion about various features and several exemplary compositions of the glass interposer 406.

Glass Interposer 406: Fabrication

The glass interposer 406 can be made by a glass manufacturing system that uses a fusion process to fabricate glass sheets which can be cut into the desired shape of the glass interposer 406. The glass interposer 406 can have any desired shape such as a 300 mm diameter circle (for example). An advantage of the glass manufacturing system which uses the fusion process is that the resulting glass interposer 406 can be made to have a uniform thickness on the order of 25 um to 200 um, without having to polish or otherwise finish the first surface 416 or the second surface 418. Plus, the non-polished glass interposer 406 can have very high quality surface features such as a total thickness variation (TTV) of less than 1.0 um, a warp at less than 30 um, and a surface roughness measured in range of about 0.35 nm Ra (see FIGS. 10-11 for discussion about total thickness variation and warp). An exemplary glass manufacturing system that uses the fusion process which can manufacture the glass interposer 406 is discussed in detail below with respect to FIGS. 8-9. Alternatively, the glass interposer 406 can be manufactured by any glass manufacturing system and then polished or etched to have the desired uniform thickness on the order of 25 um to 200 um, the desired total thickness variation of less than 1.0 um, the desired warp at less than 30 um, and the desired surface roughness measured in range of about 1.0 nm Ra. Actually, the glass interposer 406 could potentially be made or polished to have a thickness less than 25 um.

Glass Interposer 406: CTE

The glass interposer 406 can have anyone of a wide range of compositions resulting in the ability to select the glass interposer's coefficient of thermal expansion (CTE) so it can match, or more closely match, the adjacent materials such as the first redistribution layer 404c and the second redistribution layer 408c in the three-dimensional integrated circuit (3D IC) 400. For instance, the glass interposer 406 can have a composition such that it has a CTE in a range of about 3.0 ppm/° C.-3.5 ppm/° C. which resembles the CTE of silicon. An exemplary composition which results in the glass interposer 406 having a CTE in a range of about 3.0 ppm/° C.-3.5 ppm/° C. isin mole percent on an oxide basis: $SiO_2$: 64.0-71.01; $Al_2O_3$: 9.0-12.0; $B_2O_3$: 7.0-12.0; MgO: 1.0-3.0; CaO: 6.0-11.5; SrO: 0-2.0; BaO: 0-0.1, wherein: (a) 1.00≤Σ[RO]/[$Al_2O_3$]≤1.25, where [$Al_2O_3$] is the mole percent of $Al_2O_3$ and Σ[RO] equals the sum of the mole percents of MgO, CaO, SrO, and BaO; and (b) the glass has at least one of the following compositional characteristics: (i) on an oxide basis, the glass comprises at most 0.05 mole percent $Sb_2O_3$; and (ii) on an oxide basis, the glass comprises at least 0.01 mole percent $SnO_2$. Alternatively, the glass interposer 406 can have a composition such that it has a CTE in a range of about 6.0 ppm/° C.-12.0 ppm/° C. An exemplary nominal composition which results in the glass interposer 406 having a CTE in a range of about 6.0 ppm/° C. is 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % SnO2. And, an exemplary nominal composition which results in the glass interposer 406 having a CTE in a range of about 10.0 ppm/° C. is an alkali-free glass comprising in mole percent on an oxide basis: SiO2 64.0-72.0; Al2O3 9.0-16.0, B2O3 1.0-5.0; MgO+ La2O3 1.0-7.5; CaO 2.0-7.5; SrO 0.0-4.5; BaO 1.0-7.0, wherein Σ(MgO+CaO+SrO+BaO+3La2O3)/(Al2O3)≥1.15, where Al2O3, MgO, CaO, SrO, BaO, and La2O3 represent the mole percents of the respective oxide components. In fact, the glass interposer 406 can have any desired CTE which is in a range of about 3.0 ppm/° C.-12.0 ppm/° C.

Glass Interposer 406: Via Formation

Figure 5A:
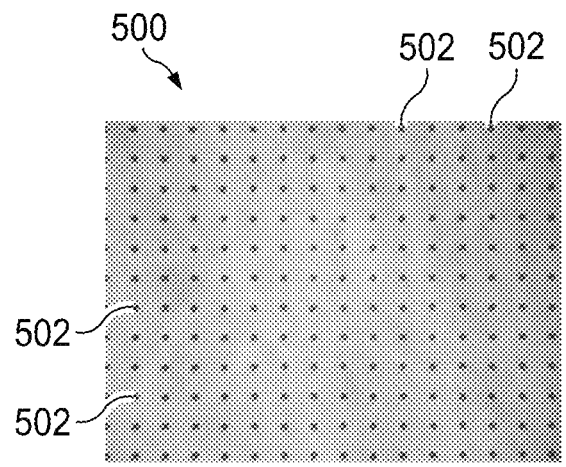
FIGS. 5A-5C are photos which respectively show a top view, a partial top via and a partial cross-sectional side view of a 100 μm thick glass sheet which had a series of vias with a 40 μm diameter formed therein which have a pitch of 200 μm.
Figure 5B:
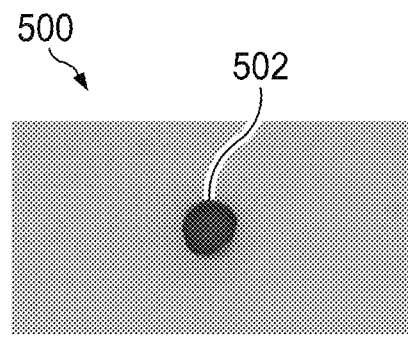
Figure 5C:
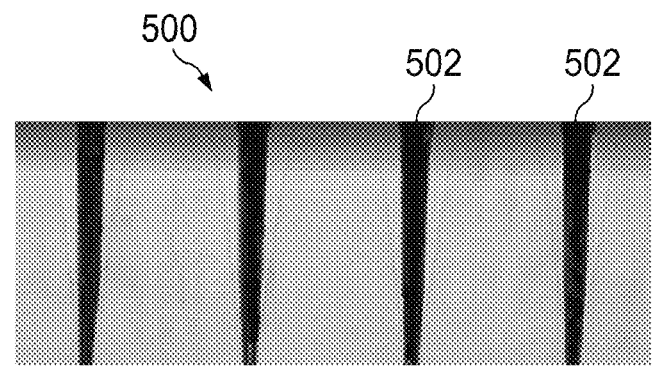

The glass interposer 406 has a plurality of vias 420a, 420b . . . 420p (for example) formed therein which extend there through from the first surface 416 to the second surface 418. For example, the vias 420a, 420b . . . 420p formed in the body 414 can have a diameter in a range of about 5 um to about 100 μm and a minimum pitch per die pattern of about 10 um to 200 μm. FIGS. 5A-5C are respectively photos illustrating a top view, a partial top via and a partial cross-sectional side view of a 100 μm thick glass sheet 500 with a composition discussed below with respect to TABLES 1-2 which had a series of vias 502 with a 40 μm diameter formed therein which had a pitch of 200 μm. The pitch is the distance between vias 502 and can have an x-component and a y-component. An exemplary process that can be used to form the vias 420a, 420b . . . 420p (for example) in the glass interposer 406 was discussed in co-assigned PCT Patent Application Serial No. PCT/US11/62520 entitled "Methods of Forming High-Density Arrays of Holes in Glass" and filed on Nov. 30, 2012 which claimed priority to U.S. Patent Application Ser. No. 61/418,152 filed on Nov. 30, 2010 (the contents of these documents are incorporated by reference herein). This exemplary process includes the following steps: (a) providing a glass piece having a front surface; (b) irradiating the front surface of the glass piece with an ultraviolet (UV) laser beam, the beam being focused by a lens within +/−100 um of the front surface of the glass piece, the lens having a numerical aperture in the range of from 0.1 to 1.5, so as to produce open holes extending into the glass piece from the front surface of the glass piece, the holes having an diameter the in range of from 5-100 μm, and an aspect ratio of at least 20:1.

The unique combination of cost effective forming of a glass sheet with a compositional flexibility (e.g., CTE flexibility) that can be cut into the desired glass interposer 406 which has a desired thickness on the order of 50 um to 100 um, a desired total thickness variation of less than 1.0 um, a desired warp at less than 30 um, and a desired surface roughness of about 0.35 nm Ra (unpolished) and about 1.0 nm (polished) along with precision formed vias 420a, 420b . . . 420p (for example) has enabled an entirely new architecture not previously available to the market. This enabled architecture results in a thin glass body 414 having precision vias 420a, 420b . . . 420p (for example) which are not metalized vias such as in traditional interposers but are pass through vias 420a, 420b . . . 420p (for example) which enable interconnects between the first conductive pillars 410a, 410b . . . 410p and second conductive pillars 412a, 412b . . . 412p) on each side of the glass interposer 406 (see FIG. 4B). The precision interconnect of the first conductive pillars 410a, 410b . . . 410p and the second conductive pillars 412a, 412b . . . 412p) meet in the middle of the precision vias 420a, 420b . . . 420p (for example) to establish electrical connectivity while preserving perfect insulation (or substantially perfect insulation) elsewhere between the die as well as other adjacent electrical connections through the glass body 414.

Figure 3:
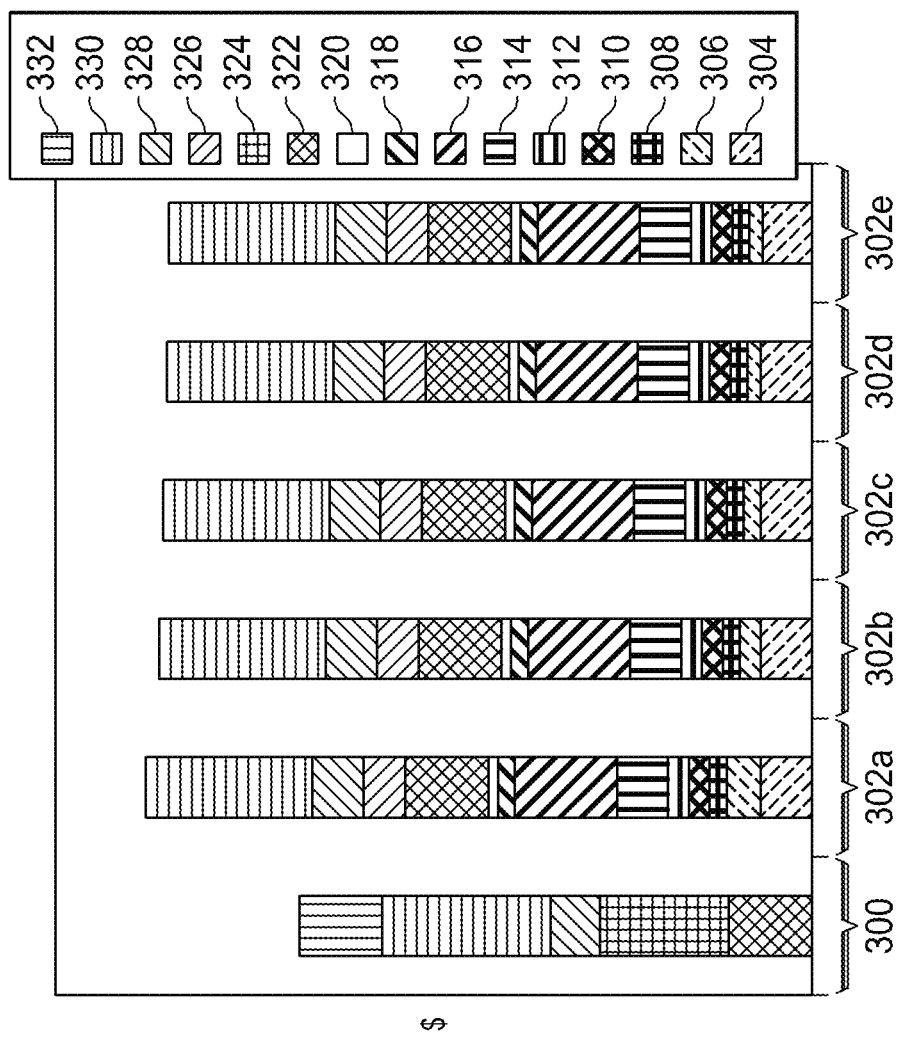
FIG. 3 (PRIOR ART) is a graph which illustrates the different steps and associated relative costs for performing the wire bond process and the DRIE process utilizing a 300 mm outer diameter silicon wafer.

Referring again to FIGS. 4A-4B, the glass interposer 406 is configured such that the vias 420a, 420b . . . 420p (for example) are not metalized as is done with traditional interposers and this enables precision bonds between the first conductive pillars 410a, 410b . . . 410p and the second conductive pillars 412a, 412b . . . 412p to be formed within the precision vias 420a, 420b . . . 420p. The elimination of the conductive material fill step process (see step 316 in FIG. 3) delivers major advantages and is only possible with the glass interposer 406. In addition, the first conductive pillars 410a, 410b . . . 410p and the second conductive pillars 412a, 412b . . . 412p can be respectively deposited on the first redistribution layer 408c and the second redistribution layer 408c using a lithography process. Therefore, the first conductive pillars 410a, 410b . . . 410p and the second conductive pillars 412a, 412b . . . 412p due to the lithography process will have an aspect ratio of 2:1 for height to diameter. As a result, a 20 um high conductive pillar for example can only be made to a minimum of 10 um diameter and this means that a pair of conductive pillars 410a and 412a would typically be used and they would have to interface within the glass interposer 406 rather than using one redistribution layer with one long conductive pillar 410a traversing the width of the glass interposer 406 to contact a "bump" on the other redistribution layer. Furthermore, the precision bonds between the first conductive pillars 410a, 410b . . . 410p and the second conductive pillars 412a, 412b . . . 412p is only feasible within the glass interposer 406 which provides perfect electrical isolation (or substantially perfect electrical isolation).

The three-dimensional integrated circuit 400 which incorporates the aforementioned glass interposer 406 has many advantages some of which are discussed below:

1. The composition of glass interposer 406 can be selected such that it has a CTE which matches to the composite structure of the first circuit component 402, the first redistribution layers 404a, 404b and 404c (including the first conductive pillars 410a, 410b . . . 410p), the second redistribution layers 408a, 408b and 408c (including the second conductive pillars 412a, 412b . . . 412p), and the second circuit component 409. This greatly improves reliability during thermal transients and ordinary cycling.

2. Cost effectiveness of using the fusion process to fabricate the glass interposer 406 without needing to perform any polishing or finishing steps (see also FIGS. 8-9). For example, this eliminates the cost of step 322 in FIG. 3.

3. The glass interposer 406 is a very good insulator and a much better insulator than a silicon interposer. Plus, the architecture of the three-dimensional integrated circuit 400 would not be possible with a silicon interposer as the conductive pillars 410a, 410b . . . 410p and 412a, 412b . . . 412p would not be able to touch the sides of the vias in the silicon interposer because it is a semi-conductor. For example, this eliminates the cost of step 310 in FIG. 3.

4. The glass interposer 406 has vias 420a, 420b . . . 420p which do not have metal electroplating and are not filled with a conductive material such as copper, tin, nickel, gold or silver. Hence, the high cost metal electroplating and solder steps 316 (see FIG. 3) do not need to be performed.

5. A critical failure mechanism in the traditional three-dimensional integrated circuit with the silicon interposer is that it has a differential CTE and when the copper expands at a higher rate than the surrounding material then the silicon interposer "pistons" outward pressing into the bumps and redistribution layers. However, with the architecture of the three-dimensional integrated circuit 400 with the matching CTE there is radial freedom for the glass interposer 406 to expand and relax axial stress thus completely eliminating this failure mode.

6. The reduced cost associated with fabricating the three-dimensional integrated circuit 400. Some of these reduced costs are as follows:

A. The fusion process can be used to manufacture the glass interposer 406 which is probably two orders of magnitude less expensive than cost of manufacturing a silicon interposer to have the final required thickness of 50 um-200 um.

B. The glass interposer 406 can be manufactured without having to perform the lithography step 304, the etching step 306, the dielectric liner step 310, the barrier and seed steps 312, and the metal electroplating and solder steps 316 needed to make the silicon interposer (see FIG. 3).

C. The glass interposer 406 by not needing to fill the vias 420a, 420b ... 420p with a conductive material means that the quality required of the holes through the glass can be much lower. This is because the shape of the vias 420a, 420b ... 420p is not so critical, wall roughness becomes irrelevant, and the exact replication of precisely formed vias is no longer required when compared to making the silicon interposer which has vias that are filled with a conductive material. In addition, the manufacturing rate of the glass interposer 406 can be increased and less expensive lasers and optics can be used to make multiple vias simultaneously when compared to making the silicon interposer with vias that are filled with a conductive material.

Figure 6A:
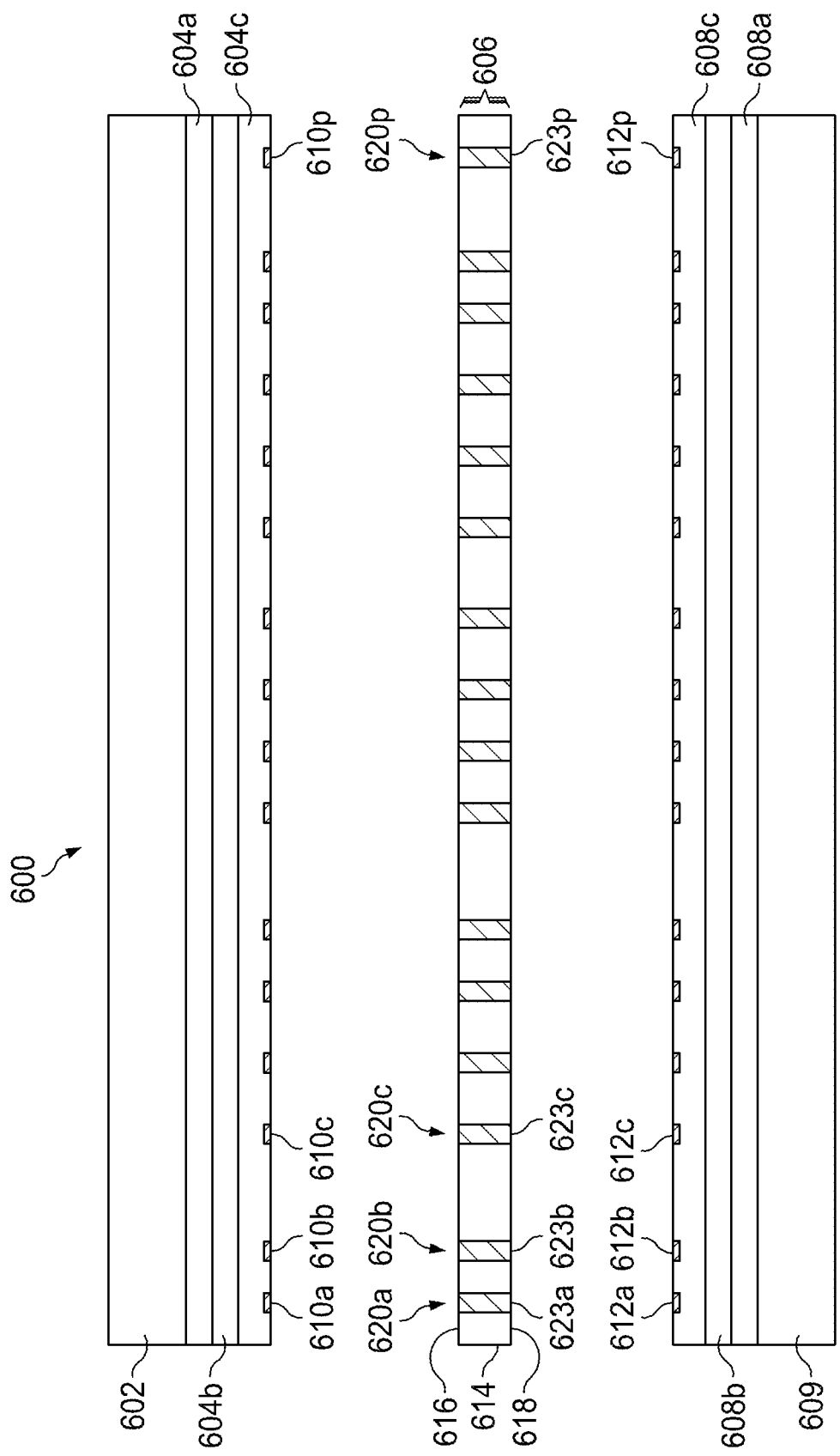
FIGS. 6A-6B respectively show a partially exploded side view and an assembled side view of a three-dimensional integrated circuit configured in accordance with another embodiment of the present invention.
Figure 6B:
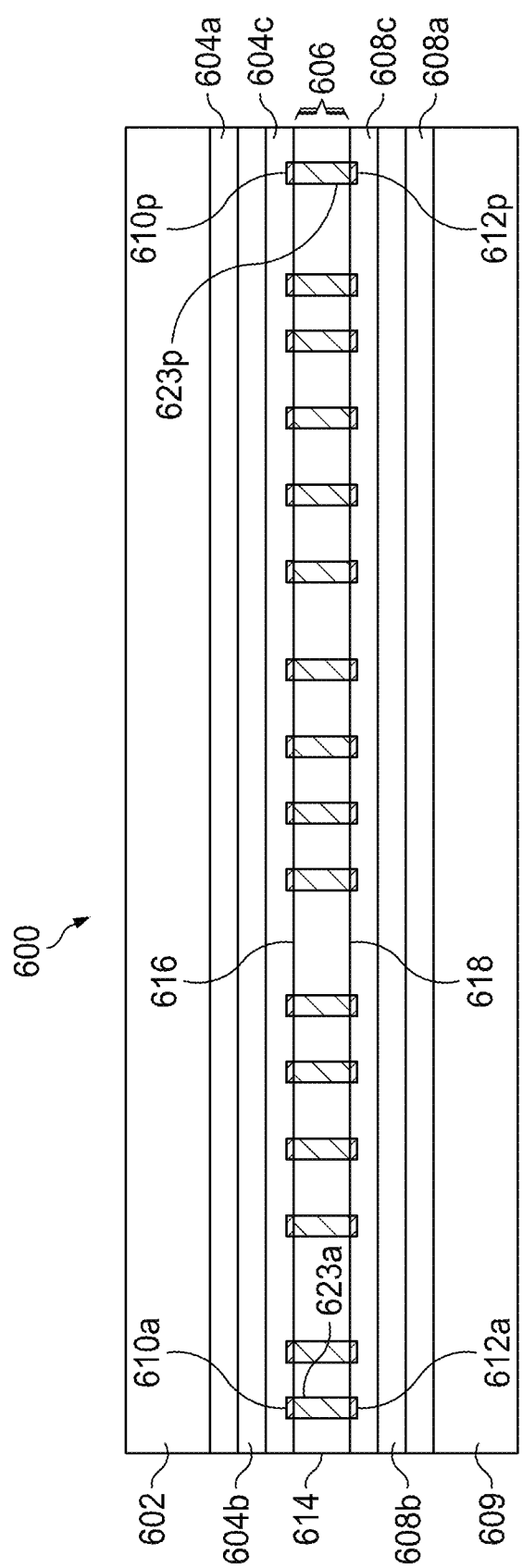

Referring to FIGS. 6A-6B, there are respectively shown a partially exploded side view and an assembled side view of a three-dimensional integrated circuit 600 configured in accordance with another embodiment of the present invention. The three-dimensional integrated circuit 600 includes a first circuit component 602 (e.g., die 602, motherboard 602), one or more first redistribution layers 604a, 604b and 604c (three shown), a glass interposer 606, one or more second redistribution layers 608a, 608b and 608c (three shown), and a second circuit component 609 (e.g., die 609, motherboard 609). The first redistribution layer 604c has a plurality of first conductive bumps 610a, 610b ... 610p (for example). Likewise, the second redistribution layer 608c has a plurality of second conductive bumps 612a, 612b ... 612p (for example). The glass interposer 606 has a body 614 including a first surface 616 and a second surface 618 which are substantially parallel to each other. The body 614 has a plurality of vias 620a, 620b ... 620p (for example) formed therein which extend there through from the first surface 616 to the second surface 618. The vias 620a, 620b ... 620p (through glass vias (TGVs) 620a, 620b ... 620p) have metal electroplating and are filled with a conductive material 623a, 623b ... 623p (for example) such as for example copper, tin, nickel, gold or silver. The three-dimensional integrated circuit 600 may include additional components which are known in the field but for clarity only those components which are needed to explain and enable the present invention are described herein.

The three-dimensional integrated circuit 600 is fabricated such that the one or more first redistribution layers 604a, 604b and 604c are positioned between the first circuit component 602 and the first surface 616 of the glass interposer 606. Likewise, the one or more second redistribution layers 608a, 608b and 608c are positioned between the second circuit component 609 and the second surface 618 of the glass interposer 606. The glass interposer 606 is positioned between the first redistribution layer 604c and the second redistribution layer 608c such that each one of the first conductive bumps 610a, 610b ... 610p contacts one side of the corresponding via's conductive material 623a, 623b ... 623p and each one of the second conductive bumps 612a, 612b ... 612p contacts another side of the corresponding via's conductive material 623a, 623b ... 623p. A detailed discussion is provided next about how the glass interposer 606 can be fabricated along with a discussion about various features and several exemplary compositions of the glass interposer 606.

Glass Interposer 606: Fabrication

The glass interposer 606 can be made by a glass manufacturing system that uses a fusion process to fabricate glass sheets which can be cut into the desired shape of the glass interposer 606. The glass interposer 606 can have any desired shape such as a 300 mm diameter circle (for example). An advantage of the glass manufacturing system which uses the fusion process is that the resulting glass interposer 606 can be made to have a uniform thickness on the order of 25 um to 200 um, without having to polish or otherwise finish the first surface 616 or the second surface 618. Plus, the non-polished glass interposer 606 can have very high quality surface features such as a total thickness variation of less than 1.0 um, a warp at less than 30 um, and a surface roughness measured in range of about 0.35 nm Ra (see FIGS. 10-11 for discussion about total thickness variation and warp). An exemplary glass manufacturing system that uses the fusion process which can manufacture the glass interposer 606 is discussed in detail below with respect to FIGS. 8-9. Alternatively, the glass interposer 606 can be manufactured by any glass manufacturing system and then polished or etched to have the desired uniform thickness on the order of 25 um to 200 um, the desired total thickness variation of less than 1.0 um, the desired warp at less than 30 um, and the desired surface roughness measured in range of about 1.0 nm Ra. Actually, the glass interposer 606 could potentially be made or polished to have a thickness less than 25 um.

Glass Interposer 606: CTE

The glass interposer 606 can have anyone of a wide range of compositions resulting in the ability to adjust the coefficient of thermal expansion (CTE) so it can match, or more closely match, the adjacent materials such as the first redistribution layer 604c and the second redistribution layer 608c in the three-dimensional integrated circuit (3D IC) 600. This is a desirable feature as will become apparent after discussing a problem associated with a traditional three-dimensional integrated circuit that incorporates a silicon interposer.

Figure 7:
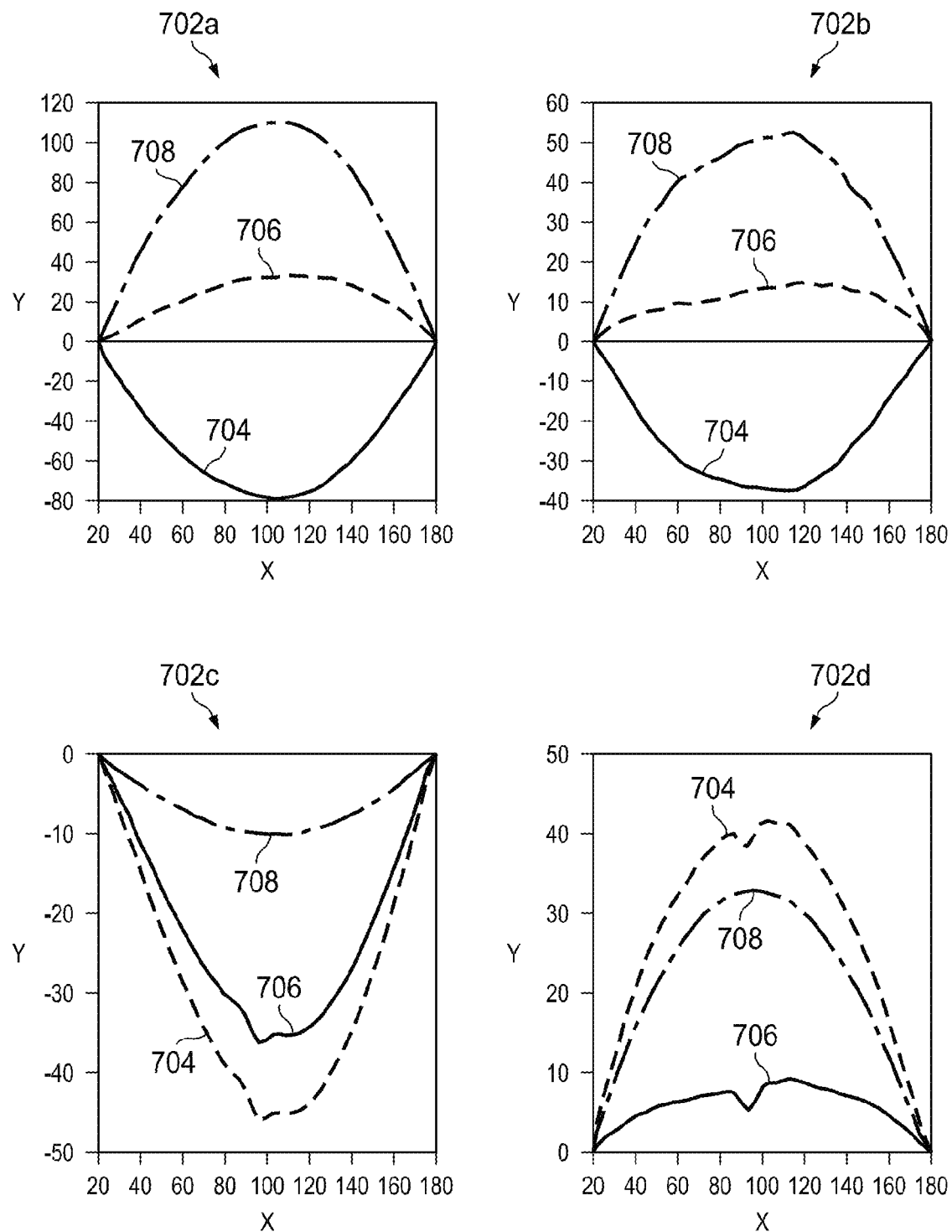
FIG. 7 (PRIOR ART) shows four graphs which demonstrate the significant impact that the thickness of a silicon interposer has on the warp performance of a bonded stack of integrated circuits over temperature.

Referring again to FIG. 2 (PRIOR ART), the Xilinx 3D IC FPGA 200 which incorporates the silicon interposer 202 has interconnect material (redistribution layers with metal "bumps") on either side thereof which is not silicon but which have a CTE that is much greater than silicon's CTE of 3.2 ppm/° C. If the silicon interposer 202 is thick at say about 700 um, then these redistribution layers and metal "bumps" have a minimal effect on the CTE of the composite structure. However, if the silicon interposer 202 is thin as it is required to be, then the redistribution layers and metal "bumps" play a critical role and the CTE of the composite structure is increased as will be discussed next. Referring to FIG. 7 (PRIOR ART), there are four graphs 702a, 702b, 702c and 702d which have been provided to demonstrate the significant impact that the thickness of the silicon interposer with integrated circuits has on the warp performance of a bonded stack of layers over temperature. The graphs 702a, 702b, 702c and 702d have the following features: (a) the x-axis is distance (mm); (b) the y-axis is deflection (um); (c) the line 704 represents room temperature 25° C.; (d) the line 706 represents 200° C.; and (e) the line 708 represents the difference between room temperature 25° C. and 200° C.

Graph 702a: 0.7 mm thick glass with CTE 3.2 ppm; 0.06 mm adhesive; 0.7_mm Si; max bow=−80 um; and total Δbow=115 um.

Graph 702b: 0.7 mm thick glass with CTE 3.2 ppm; 0.06 mm adhesive; 0.072 mm Si; max bow=40 um; and total Δbow=−50 um.

Graph 702c: 0.7 mm thick glass with CTE 3.2 ppm; 0.06 mm adhesive; 0.05 mm Si; max bow=−45 um; and total Δbow=10 um.

Graph 702d: 0.7 mm thick glass with CTE 3.2 ppm; 0.06 mm adhesive; 0.02 mm Si; max bow=40 um; and total Δbow=35 um.

As can be seen, the traditional three-dimensional integrated circuit which incorporates a silicon interposer with vias filled with a conductive material has a problematic bow. In contrast, the three-dimensional integrated circuit 600 with the glass interposer 606 which has vias 620a, 620b . . . 620p (for example) filled with the conductive material 623a, 623b . . . 623p (for example) would not have the problematic bow. Instead, the three-dimensional integrated circuit 600 can be manufactured to incorporate the glass interposer 606 which has a CTE that is different than the CTE of silicon which is 3.2 ppm/° C. In particular, the glass interposer 606 can be made with different glass compositions to have different CTEs depending on the particular application. For instance, the glass interposer 606 can have a composition such that it has a CTE in a range of about 3.3 ppm/° C.-12.0 ppm/° C. An exemplary nominal composition which results in the glass interposer 406 having a CTE in a range of about 6.0 ppm/° C. is 69.2 mol % SiO2, 8.5 mol % Al2O3, 13.9 mol % Na2O, 1.2 mol % K2O, 6.5 mol % MgO, 0.5 mol % CaO, and 0.2 mol % SnO2. And, an exemplary nominal composition which results in the glass interposer 406 having a CTE in a range of about 10.0 ppm/° C. is an alkali-free glass comprising in mole percent on an oxide basis: SiO2 64.0-72.0; Al2O3 9.0-16.0, B2O3 1.0-5.0; MgO+La2O3 1.0-7.5; CaO 2.0-7.5; SrO 0.0-4.5; BaO 1.0-7.0, wherein Σ(MgO+CaO+SrO+BaO+3La2O3)/(Al2O3)≥1.15, where Al2O3, MgO, CaO, SrO, BaO, and La2O3 represent the mole percents of the respective oxide components.

Glass Interposer 606: Via Formation

The glass interposer 606 has vias 620a, 620b . . . 620p (for example) filled with the conductive material 623a, 623b . . . 623p (for example). The vias 620a, 620b . . . 620p can have a diameter in a range of about 5 um to about 100 μm and a minimum pitch per die pattern of about 10 um to 200 μm. The process used to form the vias 620a, 620b . . . 620p may need to be more detailed than the process described above with respect to the glass interposer 406 which has vias 420a, 420b . . . 420p that are not filled with a conductive material. This is because the shape, wall roughness, and replication of the vias 620a, 620b . . . 620p is much more critical when the vias 620a, 620b . . . 620p are filled with the conductive material 623a, 623b . . . 623p than if the vias 620a, 620b . . . 620p were not filled with the conductive material 623a, 623b . . . 623p.

Figures 1, 2:
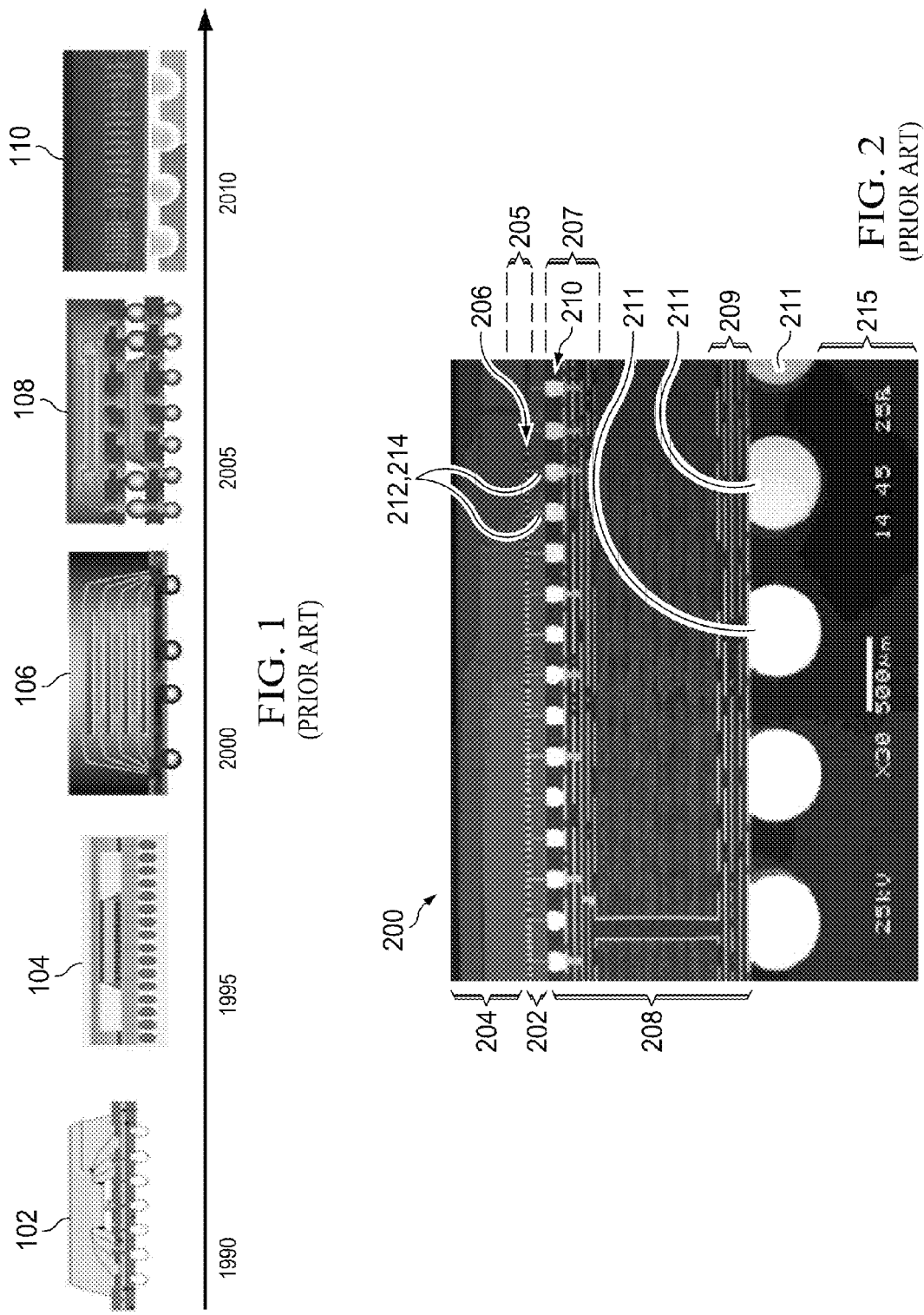
FIG. 1 (PRIOR ART) is a diagram illustrating how the packaging of integrated circuits has evolved over the years from wire bound, flip chip, stacked die, package-on-package to 3D IC.
FIG. 2 (PRIOR ART) is a photo illustrating a cross-sectional side view of a 3D IC FPGA which incorporates a silicon interposer.

The skilled person should appreciate that the three-dimensional integrated circuits 400 and 600 described above can have configurations different than using just one first circuit component 402 and 602 and just one second circuit component 409 and 609. For instance, the three-dimensional integrated circuits 400 and 600 can have n circuit dies stacked with m glass interposers 406 and 606 in an alternating structure such as a stack of 3, 4, 5, 6 etc. circuit dies and 2, 3, 4, 5 etc. glass interposers 406 and 606 with no theoretical limit just a practical limit. The point is that the three-dimensional integrated circuits 400 and 600 can have more than just one circuit component on top of the glass interposer 406 and 606, and more than one circuit component below the glass interposer 406 and 606 In addition, the glass interposers 406 and 606 can be utilized in what is known as a "2.5D IC" structure, such as shown in FIG. 2 where the glass interposer 406 and 606 can be located directly between a die and a wiring board.

The following is a discussion about an exemplary glass manufacturing system that can manufacture the glass sheets from which are cut into the desired shape and processed (via formation) to form multiple glass interposers 406 and 606 that have the non-polished first surfaces 416 and 616 and the non-polished second surfaces 418 and 618 along with the aforementioned physical and compositional attributes. The exemplary glass manufacturing system utilizes a glass forming process known as the fusion process where the two surfaces of the glass sheet are formed in air so no polishing of the two surfaces is required. One exemplary glass manufacturing system that uses the fusion process to make a glass sheet that can be cut to fabricate the glass interposer 406 and 606 is described below with respect to FIGS. 8-9.

Figure 8:
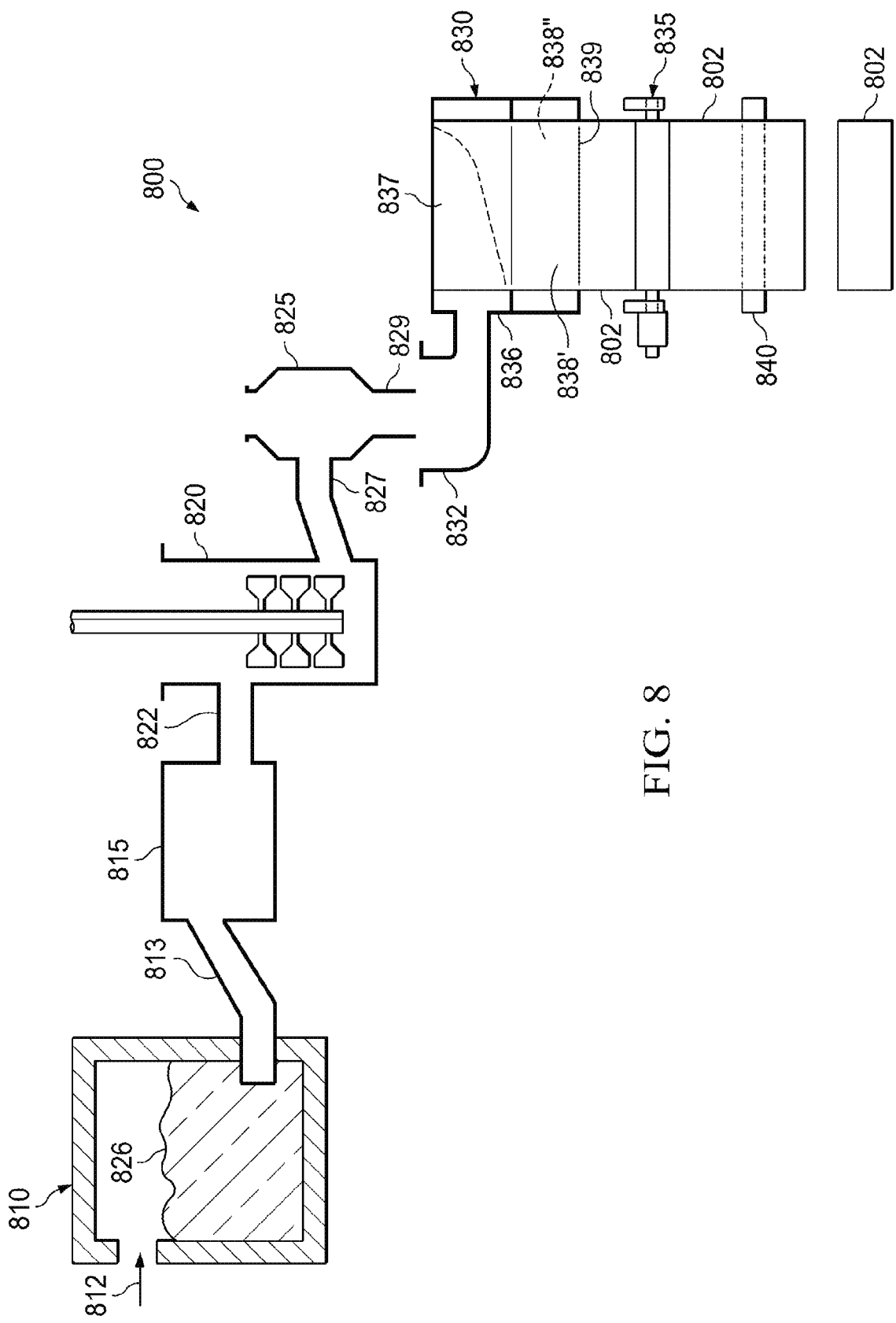
FIG. 8 is a schematic view of an exemplary glass manufacturing system that uses the fusion process and an isopipe to manufacture a non-polished glass sheet which can be cut and further processed to form a glass interposer in accordance with an embodiment of the present invention.

Referring to FIG. 8, there is a schematic view of an exemplary glass manufacturing system 800 which uses a fusion draw process to manufacture a non-polished glass sheet 802 that can be cut and further processed to form the glass interposer 406 and 606 in accordance with an embodiment of the present invention. The exemplary glass manufacturing system 800 includes a melting vessel 810, a fining vessel 815, a mixing vessel 820 (e.g., stir chamber 820), a delivery vessel 825 (e.g., bowl 825), an isopipe 830 (e.g., forming apparatus 830), a pull roll assembly 835, and a traveling anvil machine 840. The melting vessel 810 is where glass batch materials are introduced, as shown by arrow 812, and melted to form molten glass 826. The fining vessel 815 (i.e., finer tube 815) has a high temperature processing area that receives the molten glass 826 (not shown at this point) via a refractory tube 813 from the melting vessel 810 and in which bubbles are removed from the molten glass 826. The fining vessel 815 is connected to the mixing vessel 820 (i.e., stir chamber 820) by a finer to stir chamber connecting tube 822. The mixing vessel 820 is connected to the delivery vessel 825 by a stir chamber to bowl connecting tube 827. The delivery vessel 825 delivers the molten glass 826 through a downcomer 829 to an inlet 832 and into the isopipe 830. The isopipe 830 includes an inlet 836 that receives the molten glass 826 which flows into a trough 837 and then overflows and runs down two sides 838' and 838" before fusing together at what is known as a root 839 (see FIG. 9). The root 839 is where the two sides 838' and 838" come together and where the two overflow walls of the molten glass 826 rejoin (i.e., re-fuse) before being drawn downward between two rolls in the pull roll assembly 830 to form the glass sheet 802. The traveling anvil machine 840 then cuts the glass sheet 802 into distinct glass sheets 802 which are later cut into the desired shape for the glass interposer 406 and 606 A more detailed discussion about an exemplary configuration of the isopipe 830 is provided next with respect to FIG. 9.

Figure 9:
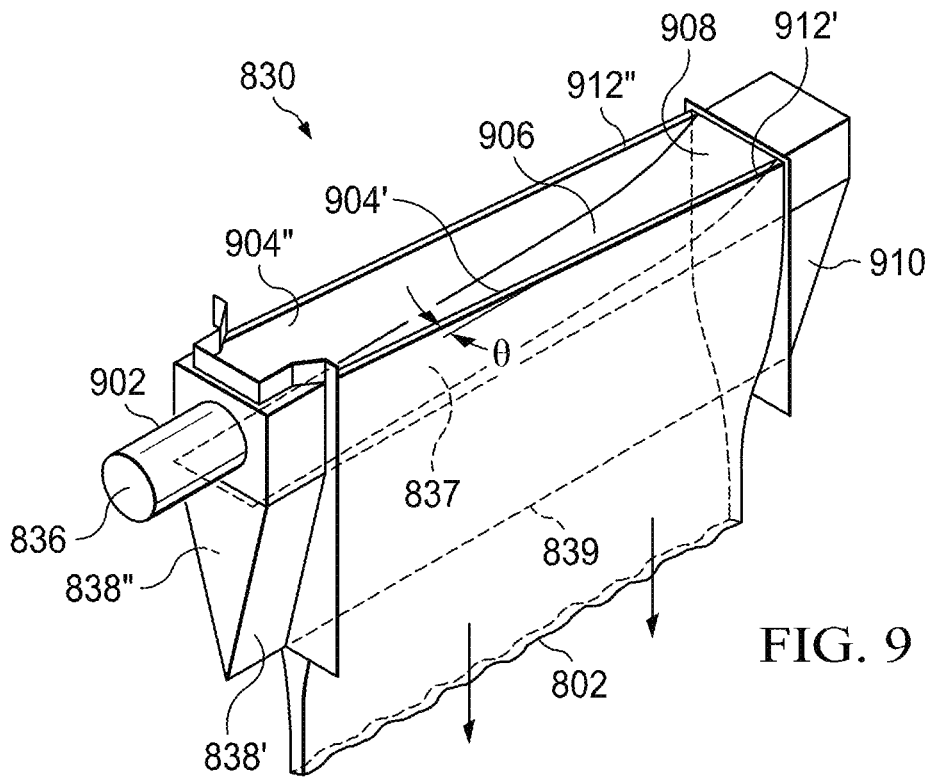
FIG. 9 is a perspective view illustrating in greater detail the isopipe shown in FIG. 8.

Referring to FIG. 9, there is a perspective view of the exemplary isopipe 830 that can be used to form the glass sheet 802. The isopipe 830 includes a feed pipe 902 that provides the molten glass 826 through the inlet 836 to the trough 837. The trough 837 is bounded by interior side-walls 904' and 904" that are shown to have a substantially perpendicular relationship, but could have any type of relationship to a bottom surface 906. In this example, the isopipe 830 has a bottom surface 906 which has a sharp decreasing height contour near the end 908 farthest from the inlet 836. If desired, the isopipe 830 can have a bottom surface 906, which has located thereon an embedded object (embedded plow) near the end 808 farthest from the inlet 836.

The exemplary isopipe 830 has a cuneiform/wedge shaped body 910 with the oppositely disposed converging side-walls 838' and 838". The trough 837 having the bottom surface 906, and possibly the embedded object (not shown), is longitudinally located on the upper surface of the wedge-shaped body 910. The bottom surface 906 and embedded object (if used) both have mathematically described patterns that become shallow at end 908, which is the end the farthest from the inlet 836. As shown, the height between the bottom surface 906 and the top surfaces 912' and 912" of the trough 837 decreases as one moves away from the inlet 836 towards the end 908. However, it should be appreciated that the height can vary in any manner between the bottom surface 906 and the top surfaces 912' and 912". It should also be appreciated that the cuneiform/wedge shaped body 910 may be pivotally adjusted by a device such as an adjustable roller, wedge, cam or other device (not shown) to provide a desired tilt angle shown as θ which is the angular variation from the horizontal of the parallel top surfaces 912' and 912".

In operation, the molten glass 826 enters the trough 837 through the feed pipe 902 and inlet 836. The molten glass 826 wells over the parallel top surfaces 912' and 912" of the trough 837, divides, and flows down each side of the oppositely disposed converging sidewalls 838' and 838" of the wedge-shaped body 910. At the bottom of the wedge portion, or root 839, the divided molten glass 826 rejoins to form the glass sheet 802 which has very flat and smooth non-polished surfaces. The high surface quality of the glass sheet 802 results from a free surface of molten glass 826 that divides and flows down the oppositely disposed converging side-walls 838' and 838" and forming the exterior surfaces of the glass sheet 802 without coming into contact with the outside of the isopipe 830.

The glass sheet 802 can be obtained by using anyone of a variety of glass compositions (batch materials). For example, the glass composition chosen can be any of a wide range of silicate, borosilicate, aluminosilicate, or boroaluminosilicate glass compositions, which optionally can comprise one or more alkali and/or alkaline earth modifiers. By way of illustration, one such glass composition includes the following constituents: 58-72 mole percent (mol %) SiO2; 9-17 mol % Al2O3; 2-12 mol % B2O3; 8-16 mol % Na2O; and 0-4 mol % K2O, wherein the ratio $$\frac{Al_2O_3 (mol\ \%) + B_2O_3\ (mol\ \%)}{\sum modifiers\ (mol\ \%)} > 1,$$

where the modifiers comprise alkali metal oxides. Another glass composition includes the following constituents: 61-75 mol % SiO2; 7-15 mol % Al2O3; 0-12 mol % B2O3; 9-21 mol % Na2O; 0-4 mol % K2O; 0-7 mol % MgO; and 0-3 mol % CaO. Yet another illustrative glass composition includes the following constituents: 60-70 mol % SiO2; 6-14 mol % Al2O3; 0-15 mol % B2O3; 0-15 mol % Li2O; 0-20 mol % Na2O; 0-10 mol % K2O; 0-8 mol % MgO; 0-10 mol % CaO; 0-5 mol % ZrO2; 0-1 mol % SnO2; 0-1 mol % CeO2; less than 50 parts per million (ppm) As2O3; and less than 50 ppm Sb2O3; wherein 12 mol %≤Li2O+Na2O+K2O≤20 mol % and 0 mol %≤MgO+CaO≤10 mol %. Still another illustrative glass composition includes the following constituents: 55-75 mol % SiO2, 8-15 mol % Al2O3, 10-20 mol % B2O3; 0-8% MgO, 0-8 mol % CaO, 0-8 mol % SrO and 0-8 mol % BaO. Further, the substrate optionally can be annealed and/or strengthened (e.g., by thermal tempering, chemical ion-exchange, or like processes).

Figure 10:
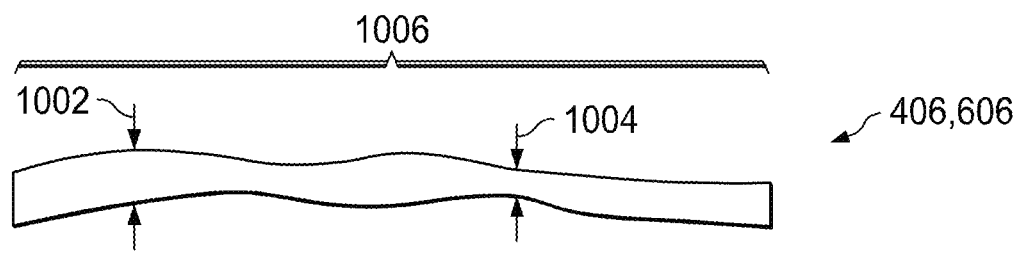
FIG. 10 is a schematic diagram of an exemplary glass interposer used to explain total thickness variation (TTV) which is defined to be the difference between a highest thickness (Tmax) elevation and a lowest thickness (Tmin) elevation on the entire surface of the unclamped (free state) glass interposer.

Referring to FIG. 10, there is a schematic diagram of an exemplary glass interposer 406 and 606 used to explain total thickness variation (TTV) which is defined to be the difference between a highest thickness (Tmax) elevation 1002 and a lowest thickness (Tmin) elevation 1004 on the entire surface 1006 of the unclamped (free state) glass interposer 406 and 606. This schematic is not to scale and the glass interposer's vias 420*a*, 420*b* . . . 420*c* and 620*a*, 620*b* . . . 620*p* have not been shown so one can readily understand how TTV can be calculated.

Figure 11:
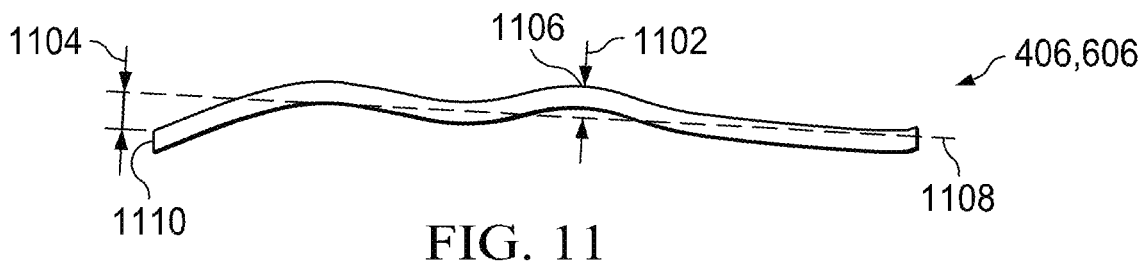
FIG. 11 is a schematic diagram of an exemplary glass interposer used to explain warp which is defined as a sum of the absolute values of the maximum distances which are measured between a highest point and a least square focal plane (dashed line) and a lowest point and the least square focal plane (dashed line) applied to a shape of the glass interposer.

Referring to FIG. 11, there is a schematic diagram of an exemplary glass interposer 406 and 606 used to explain warp which is defined as a sum of the absolute values of the maximum distances 1102 and 1104 which are respectively measured between a highest point 1106 and a least square focal plane 1108 (dashed line) applied to a shape of the glass interposer 406 and 606, and a lowest point 1110 and the least square focal plane 1108 (dashed line). The highest point 1106 and the lowest point 1110 are both with respect to the same surface of the glass interposer 406 and 606. The least square focal plane 1108 is applied to the shape of the unclamped (free state) glass interposer 406 and 606. The least square focal plane 1108 is determined by the following method. A plane is determined by the equation z=A+Bx−Cy. Then, the least squares planar fit is determined through matrix minimization of the sum of the squares of the deviations of the real data from the plane. This method finds the least square values A, B, and C. The matrices are determined as follows:

$$\begin{bmatrix} n & \sum x_j & \sum y_i \\ \sum x_j & \sum x_j^2 & \sum x_j * y_j \\ \sum y_j & \sum x_j * y_i & \sum y_j^2 \end{bmatrix} * \begin{bmatrix} A \\ B \\ C \end{bmatrix} z$$

By solving this equation for A, B, and C, the least squares fit is complete. This schematic is not to scale and the glass interposer's vias 420*a*, 420*b* . . . 420*c* and 620*a*, 620*b* . . . 620*p* have not been shown so one can readily understand how warp can be calculated.

Although several embodiments of the present invention have been illustrated in the accompanying Drawings and described in the foregoing Detailed Description, it should be understood that the invention is not limited to the disclosed embodiments, but is capable of numerous rearrangements, modifications and substitutions without departing from the invention as set forth and defined by the following claims.

The invention claimed is:

1. A three-dimensional integrated circuit comprising:
   a first circuit component;
   one or more first redistribution layers, where one of the first redistribution layers has a plurality of first conductive pillars extending therefrom;
   a glass interposer having a body including a first surface and a second surface which are substantially parallel to each other, and where the body has a plurality of vias extending there through from the first surface to the second surface wherein the vias are not metallized;
   one or more second redistribution layers, where one of the second redistribution layers has a plurality of second conductive pillars extending therefrom;
   a second circuit component;
   the one or more first redistribution layers are positioned between the first circuit component and the first surface of the glass interposer;

the one or more second redistribution layers are positioned between the second circuit component and the second surface of the glass interposer; and the glass interposer is positioned between the one first distribution layer and the one second distribution layer such that each one of the first conductive pillars contacts a corresponding one of the second conductive pillars, and where each pair of the first and second conductive pillars contact one another within one of the vias located in the glass interposer.

2. The three-dimensional integrated circuit of claim 1, wherein the vias have a diameter in a range of about 5 um to about 100 μm.

3. The three-dimensional integrated circuit of claim 1, wherein the glass interposer is a non-polished glass interposer with a surface roughness of about 0.35 nm Ra.

4. The three-dimensional integrated circuit of claim 1, wherein the glass interposer is a polished glass interposer with a surface roughness of about 1.0 nm Ra.

5. The three-dimensional integrated circuit of claim 1, wherein the glass interposer has a coefficient of thermal expansion (CTE) in a range of about 3.0 ppm/° C.-3.5 ppm/° C.

6. The three-dimensional integrated circuit of claim 1, wherein the glass interposer has a coefficient of thermal expansion (CTE) in a range of about 6.0 ppm/° C.-12.0 ppm/° C.

7. The three-dimensional integrated circuit of claim 1, wherein the glass interposer has a thickness in a range of about 25 μm-200 μm.

8. The three-dimensional integrated circuit of claim 1, wherein the glass interposer has a total thickness variation less than about 1.0 μm, and a warp less than about 30 μm. and a surface roughness of about 0.35 nm Ra (unpolished) and about 1.0 nm Polished.

9. The three-dimensional integrated circuit of claim 1, wherein the glass interposer is comprised in mole percent on an oxide basis:

$SiO_2$: 64.0-71.0
$Al_2O_3$: 9.0-12.0
$B_2O_3$: 7.0-12.0
MgO: 1.0-3.0
CaO: 6.0-11.5
SrO: 0-2.0
BaO: 0-0.1 wherein:
(a) $1.00 \leq \Sigma[RO]/[Al_2O_3] \leq 1.25$,
where $[Al_2O_3]$ is the mole percent of $Al_2O_3$ and $\Sigma[RO]$ equals the sum of the mole percents of MgO, CaO, SrO, and BaO; and
(b) the glass has at least one of the following compositional characteristics:
  (i) on an oxide basis, the glass comprises at most 0.05 mole percent $Sb_2O_3$;
  (ii) on an oxide basis, the glass comprises at least 0.01 mole percent $SnO_2$.

10. The three-dimensional integrated circuit of claim 1, wherein the glass interposer comprises a nominal composition of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$.

11. The three-dimensional integrated circuit of claim 1, wherein the glass interposer comprises in mole percent on an oxide basis: $SiO_2$ 64.0-72.0; $Al_2O_3$ 9.0-16.0; $B_2O_3$ 1.0-5.0; $MgO+La_2O_3$ 1.0-7.5; CaO 2.0-7.5; SrO 0.0-4.5; BaO 1.0-7.0, wherein $\Sigma(MgO+CaO+SrO+BaO+3La_2O_3)/(Al_2O_3) \geq 1.15$, where $Al_2O_3$, MgO, CaO, SrO, BaO, and $La_2O_3$ represent the mole percents of the respective oxide components.

12. A method of fabricating a three-dimensional integrated circuit, the method comprising the steps of
providing a first circuit component;
providing one or more first redistribution layers, where one of the first redistribution layers has a plurality of first conductive pillars extending therefrom;
providing a glass interposer having a body including a first surface and a second surface which are substantially parallel to each other, and where the body has a plurality of vias extending there through from the first surface to the second surface;
providing one or more second redistribution layers, where one of the second redistribution layers has a plurality of second conductive pillars extending therefrom;
providing a second circuit component;
positioning the one or more first redistribution layers between the first circuit component and the first surface of the glass interposer;
positioning the one or more second redistribution layers between the second circuit component and the second surface of the glass interposer; and
positioning the glass interposer between the one first distribution layer and the one second distribution layer such that each one of the first conductive pillars contacts a corresponding one of the second conductive pillars, and where each pair of the first and second conductive pillars contact one another within one of the vias located in the glass interposer to thereby form a three-dimension integrated circuit wherein the vias are not metallized.

13. A three-dimensional integrated circuit comprising:
a first circuit component;
one or more first redistribution layers;
a glass interposer having a body including a first surface and a second surface which are substantially parallel to each other, where the body has a plurality of vias extending there through from the first surface to the second surface, and where the body has a coefficient of thermal expansion (CTE) that is different than the CTE of silicon which is 3.2 ppm/° C.;
one or more second redistribution layers;
a second circuit component;
the one or more first redistribution layers are positioned between the glass interposer and the first circuit component;
the one or more second redistribution layers are positioned between the glass interposer and the second circuit component; and
the glass interposer is positioned between one of the first distribution layers and one of the second distribution layers wherein the glass interposer comprises in mole percent on an oxide basis: $SiO_2$ 64.0-72.0; $Al_2O_3$ 9.0-16.0, $B_2O_3$ 1.0-5.0; $MgO+La_2O_3$ 1.0-7.5; CaO 2.0-7.5; SrO 0.0-4.5; BaO 1.0-7.0, wherein $\Sigma(MgO+CaO+SrO+BaO+3La_2O_3)/(Al_2O_3) \geq 1.15$, where $Al_2O_3$, MgO, CaO, SrO, BaO, and $La_2O_3$ represent the mole percents of the respective oxide components.

14. The three-dimensional integrated circuit of claim 13, wherein the vias are filled with a conductor.

15. The three-dimensional integrated circuit of claim 13, wherein the vias are not filled with a conductor.

16. The three-dimensional integrated circuit of claim 13, wherein the glass interposer is a non-polished glass interposer with a surface roughness of about 0.35 nm Ra.

17. The three-dimensional integrated circuit of claim 13, wherein the glass interposer is a polished glass interposer with a surface roughness of about 1.0 nm Ra.

18. The three-dimensional integrated circuit of claim 13, wherein the glass interposer has a coefficient of thermal expansion (CTE) in a range of about 3.3 ppm/° C.-12.0 ppm/° C.

19. The three-dimensional integrated circuit of claim 13, wherein the glass interposer has a thickness in a range of about 25 μm-200 μm.

20. The three-dimensional integrated circuit of claim 13, wherein the glass interposer has a total thickness variation less than about 1.0 μm, and a warp less than about 30 μm.

21. A three-dimensional integrated circuit comprising:
a first circuit component;
one or more first redistribution layers;
a glass interposer having a body including a first surface and a second surface which are substantially parallel to each other, where the body has a plurality of vias extending there through from the first surface to the second surface, and where the body has a coefficient of thermal expansion (CTE) that is different than the CTE of silicon which is 3.2 ppm/° C.;
one or more second redistribution layers;
a second circuit component;
the one or more first redistribution layers are positioned between the glass interposer and the first circuit component;
the one or more second redistribution layers are positioned between the glass interposer and the second circuit component; and
the glass interposer is positioned between one of the first distribution layers and one of the second distribution layers,
wherein the glass interposer comprises a nominal composition of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$.

* * * * *